(12) United States Patent
Hasuo et al.

(10) Patent No.: US 6,982,121 B2
(45) Date of Patent: Jan. 3, 2006

(54) ANODIZATION-ADAPTED ALUMINUM ALLOY AND PLASMA-TREATING APPARATUS MADE THEREOF

(75) Inventors: Syunji Hasuo, Fukuoka (JP); Mineo Gonta, Fukuoka (JP)

(73) Assignee: Kyushyu Mitsui Aluminum Co. Ltd., Fukuoka (JP)

( * ) Notice: Subject to any disclaimer, the term of this patent is extended or adjusted under 35 U.S.C. 154(b) by 0 days.

(21) Appl. No.: 10/657,337

(22) Filed: Sep. 8, 2003

(65) Prior Publication Data

US 2004/0050490 A1    Mar. 18, 2004

(30) Foreign Application Priority Data

Sep. 10, 2002    (JP)    ............... 2002-263605

(51) Int. Cl.
*B32B 15/00*    (2006.01)
*C22C 21/06*    (2006.01)

(52) U.S. Cl. .................. 428/650; 420/542; 420/543; 420/552; 118/715; 118/723 R

(58) Field of Classification Search ............... 428/469, 428/472, 472.1, 472.2, 650; 420/542, 543, 420/552; 118/715, 723 R, 156, 252, 11
See application file for complete search history.

(56) References Cited

U.S. PATENT DOCUMENTS

| 3,616,420 | A | * | 10/1971 | Broughton | ............. | 204/196.24 |
| 5,437,746 | A | * | 8/1995 | Usui et al. | ................... | 148/439 |
| 5,988,262 | A | * | 11/1999 | Hasegawa et al. | .......... | 164/484 |
| 6,306,342 | B2 | * | 10/2001 | Koch et al. | ................. | 420/543 |
| 6,659,331 | B2 | * | 12/2003 | Thach et al. | ............. | 228/112.1 |
| 6,713,188 | B2 | * | 3/2004 | Wu et al. | ................. | 428/472.2 |

FOREIGN PATENT DOCUMENTS

| JP | 8-269599 | 10/1996 |
| JP | 8-311593 | 11/1996 |
| JP | 9-217197 | 8/1997 |
| JP | 10-088271 | 4/1998 |
| JP | 10-226857 | 8/1998 |
| JP | 2000-313996 | 11/2000 |
| JP | 2001-220637 | 8/2001 |

* cited by examiner

*Primary Examiner*—Jennifer McNeil

(74) *Attorney, Agent, or Firm*—Jordan and Hamburg LLP

(57) ABSTRACT

An anodization-adapted aluminum alloy containing 2.0 to 3.5 wt % Mg and the remainder of 99.9 wt % or greater high-purity aluminum.

2 Claims, 3 Drawing Sheets

| Cu | Fe | Zn | Si | Mg | Ni | Cr | Ti | V | Mn | (ppm) B |
|---|---|---|---|---|---|---|---|---|---|---|
| 50 | 18 | 2 | 61 | 2.3 | 1 | 1 | 65 | 1 | 3 | 2 |

More that Mg has the value expressed by wt%.

|   | (a) | (b) |
|---|---|---|
| A | 1.11 | 3.26 |
| B | 13.89 | 14.26 |
| C | 8.16 | 11.29 |

| | (e) | (f) | (g) (μm) |
|---|---|---|---|
| A | 52.7 | 44 | 8.7 |
| B | 56.7 | 43.3 | 13.4 |
| C | 54 | 37.8 | 16.2 |

FIG. 5

| | 5052 JIS Standard | 6061 JIS Standard | 5052 commercial item | 6061 commercial item | high puriby aluminum |
|---|---|---|---|---|---|
| | wt% | wt% | wt% | wt% | ppm |
| Si | 0.25 or less | 0.40~0.80 | 0.08 | 0.72 | 18 |
| Fe | 0.40 or less | 0.70 or less | 0.19 | 0.26 | 8 |
| Cu | not specified | 0.15~0.40 | 0.03 | 0.23 | 1 |
| Mn | 0.10 or less | 0.15 or less | 0.09 | 0.006 | 1 |
| Mg | 2.2~2.8 | 0.8~1.2 | 2.4 | 0.92 | 1 |
| Cr | 0.15~0.35 | 0.04~0.35 | 0.02 | 0.019 | 1 |
| Zn | 0.10 or less | 0.25 or less | 0.01 | 0.003 | 5 |
| Ti | not specified | 0.15 or less | 0.03 | 0.018 | 1 |
| Ni | not specified | not specified | 0.006 | 0.005 | 1 |
| B | not specified | not specified | 0.001 | 0.002 | 1 |
| V | not specified | not specified | 0.013 | 0.013 | 1 |
| others each | 0.05 or less | 0.05 or less | | | |
| others total | 0.15 r less | 0.15 or less | | | |

ANODIZATION-ADAPTED ALUMINUM ALLOY AND PLASMA-TREATING APPARATUS MADE THEREOF

BACKGROUND OF THE INVENTION

1. Field of the Invention

The present invention relates to an anodization-adapted aluminum alloy and a plasma-treating apparatus made of the anodization-adapted aluminum alloy. More particularly, it relates to such an aluminum alloy and plasma-treating apparatus for service in both corrosion and plasma treatment environments.

2. Description of the Related Art

In a prior art plasma-treating apparatus for use in producing semiconductors and liquid crystal, corrosive gases and irradiating plasma heavily damage non-processed aluminum. In addition, metallic elements scattered from the material adversely affect an article to be processed such as a silicon wafer. In order to overcome such inconveniences, materials as defined by the JIS Standard, such as a 5000-series aluminum alloy (hereinafter called a "5000-series alloy") and a 6000-series aluminum alloy (hereinafter called a "6000-series alloy"), are in common uses, in which instance, the 5000- and 6000-series alloys are subjected to hard anodized aluminum treatment (hereinafter referred to as "anodization").

In recent years, causes such as micro-wiring patterns in a semi-conductor device, high-density plasma to be used, and high-corrosive gases to be used have rendered it conspicuous as an important issue to avoid deterioration and contamination of members used under plasma environments.

FIG. 5 illustrates amounts of impure elements contained in aluminum alloys, in comparison with aluminum having a high purity of 99.9 wt % (3N) or greater.

As illustrated in FIG. 5, commercially available 5052- and 6061-alloys contain considerable amounts of impure elements, when compared with the high-purity aluminum alloy. In the 5000- and 6000-series alloys, the 5052- and 6061-alloys are most widely used as materials of a plasma electrode plate and a plasma chamber. These impure elements are likely to cause defects in an anodized film. In addition, the impure elements may reside in the anodized film. This causes contamination because the impure elements residing in the anodized film are likely to fall onto an article to be processed such as a silicon wafer during plasma treatment.

In order to avoid lodging the impure elements in the anodized film, it is believed that aluminum having a high purity of 3N or greater is preferably used as a material. However, the plasma electrode plate and the plasma chamber need the strength of some 200 to 300 N/mm2, which is similar to the strength of the 5000- or 6000-series alloy. Accordingly, the high-purity aluminum smaller in strength than the 5000- and 6000-series alloys is difficult to solely employ.

In order to meet such requirements under the plasma circumstance, it has been proposed to use an aluminum alloy having Mg and Si added to high-purity aluminum (refer to published Japanese Patent Application Laid-Open No. 10-88271) and an aluminum alloy having Mg, Si, and Cu added to the high-purity aluminum (refer to published Japanese Patent Application Laid-Open No. 2001-220637).

The hitherto proposed aluminum alloys satisfy, to a certain degree, the above requirements under the plasma environment. In such aluminum alloys, the added Mg and Si precipitate $Mg_2Si$ to increase the strength of the high-purity aluminum. In this instance, minute $Mg_2Si$ is precipitated in the anodized film.

However, the minute $Mg_2Si$ precipitated in the film forms air gaps in the film. The formed air gaps inconveniently render the film susceptible to spallation during plasma irradiation, and thus inconveniently reduce the corrosion resistance of the aluminum alloy.

In the aluminum alloy taught in the published Japanese Patent Application Laid-Open No. 2001-220637 as previously discussed, the added Cu results in high-density Cu around the precipitated $Mg_2Si$ to form air gaps during anodizaiton. The formed air gaps alleviate the occurrence of cracks in the film. However, as previously discussed, the film is preferably devoid of such void spaces.

In general, members used under the plasma circumstance are costly. Accordingly, each of the costly members is removed when being worn to some degree. The film is stripped from the worn member. The worn member free of the film is again anodized, thereby forming a new film on the re-anodized member. In this way, the members are often reused. In the aluminum having $Mg_2Si$ precipitated, however, components under the plasma circumstance are heated to coarsen $Mg_2Si$ in the material. The coarsened $Mg_2Si$ inconveniently results in defects in the film and reduced corrosion resistance of the aluminum during anodization-caused film formation.

SUMMARY OF THE INVENTION

In view of the above, an object of the present invention is to provide an anodization-adapted aluminum alloy having good corrosion resistance and operable to suppress the occurrence of cracks in a film on the anodization-adapted aluminum alloy during plasma irradiation thereon under a plasma-processing environment, and to provide a plasma-treating apparatus made of the anodization-adapted aluminum alloy as discussed above.

In order to achieve the object, a first aspect of the present invention provides an anodization-adapted aluminum alloy containing 2.0 to 3.5 wt % Mg and the remainder of 99.9 wt % or greater high-purity aluminum.

A second aspect of the present invention provides an anodization-adapted aluminum alloy containing 2.0 to 3.5 wt % Mg, 0.004 to 0.01 wt % Ti, and the remainder of 99.9 wt % or greater high-purity aluminum.

In order to achieve the above object, a third aspect of the present invention provides a plasma-treating apparatus made of an anodization-adapted plasma alloy, designed to allow an article to be processed to experience predetermined treatment in a vacuum chamber, using either plasma or active species that are occurred by the plasma, the plasma-treating apparatus characterized in that one or more kinds of components selected from among the vacuum chamber and components provided in the vacuum chamber comprise an aluminum alloy member formed by an anodized aluminum alloy that contains 2.0 to 3.5 wt % Mg and the remainder of 99.9 wt % or greater high-purity aluminum.

A fourth aspect of the present invention provides a plasma-treating apparatus made of an anodization-adapted plasma alloy, designed to allow an article to be processed to experience predetermined treatment in a vacuum chamber, using either plasma or active species that are occurred by the plasma, the plasma-treating apparatus characterized in that one or more kinds of components selected from among the vacuum chamber and components provided in the vacuum chamber comprise an aluminum alloy member formed by an anodized aluminum alloy that contains 2.0 to 3.5 wt % Mg, 0.004 to 0.01 wt % Ti, and the remainder of 99.9 wt % or greater high-purity aluminum.

Mg is added to the high-purity aluminum alloy in order to provide a solid solution-hardened and improved corrosion-proof material.

More specifically, a difference in atomic radius between Mg and Al provides solution treatment of Mg, thereby providing improved material strength. In addition, the improved material strength caused by the solution-treated Mg makes it feasible to form a film free of void spaces, not encouraging $Mg_2Si$ precipitation. This feature provides an improved corrosion-proof material.

Moreover, the alloy having Mg added thereto forms $MgF_2$ in a CVD (chemical vapor deposition) apparatus that uses CF-series plasma gases. As a result, film destruction can be suppressed.

As discussed above, in order to afford improved material strength, Mg is added to aluminum to practice the solution treatment of Mg in the aluminum. The Mg content is limited to be 2.0 to 3.5 wt %. Mg in an amount of 2.0 wt % or smaller is insufficient for the improved material strength, and therefore 2.0 wt % or greater Mg must be added. 3.5 wt % or greater Mg results in a poor corrosion-proof material as well as a poor corrosion-proof film, and therefore 3.5 wt % or smaller Mg must be added.

Ti as well as Mg is added to the high-purity aluminum alloy in order to provide a material having minute crystal grains.

Adding Mg to the material coarsens the crystal grains of the material. The coarsened crystal grains differ in crystal directionality therebetween. This phenomenon grows an anodized film at different speeds, and consequently permits plasma to non-uniformly damage such formed film. In order to suppress such objectionable results, the crystal grains must be micro-structured. To achieve this purpose, Ti is added to the aluminum alloy.

As described above, Ti is added to provide minute material grains. The Ti content is limited to be 0.004 to 0.01 wt %. Ti in an amount of 0.004 wt % or smaller is insufficient for the minute crystal grains, and therefore 0.004 wt % or greater Ti must be added. Ti is an alloy to be anodized. 0.01 wt % or greater Ti in excess of a solution treatment limit in the aluminum alloy forms an anodized film in a manner similar to what aluminum does. As a result, an anodized non-uniform film having varying thickness is produced. Therefore, 0.01 wt % or smaller Ti must be added.

An anodization-adapted aluminum alloy according to the present invention and a plasma-treating apparatus fabricated of the anodization-adapted aluminum alloy according to the present invention exhibits good corrosion resistance, and operatively inhibits the occurrence of cracks in the anodized film on the anodization-adapted aluminum alloy during plasma irradiation thereon.

BRIEF DESCRIPTION OF THE DRAWINGS

FIG. 4 illustrates the thickness of each of the anodized films of the aluminum alloy according to the present invention, the 5052- and 6061-alloys before the plasma irradiation thereon, and after the plasma irradiation thereon using the $CF_4$-gas for six hours in the plasma-treating apparatus; and FIG. 5 illustrates amounts of impure elements contained in aluminum alloys, in comparison with aluminum having a high purity of 99.9 wt % (3N) or greater.

DETAILED DESCRIPTION OF PREFERRED EMBODIMENT

The best mode of the present invention is now described with reference to the accompanying drawings.

Figures 1, 2:
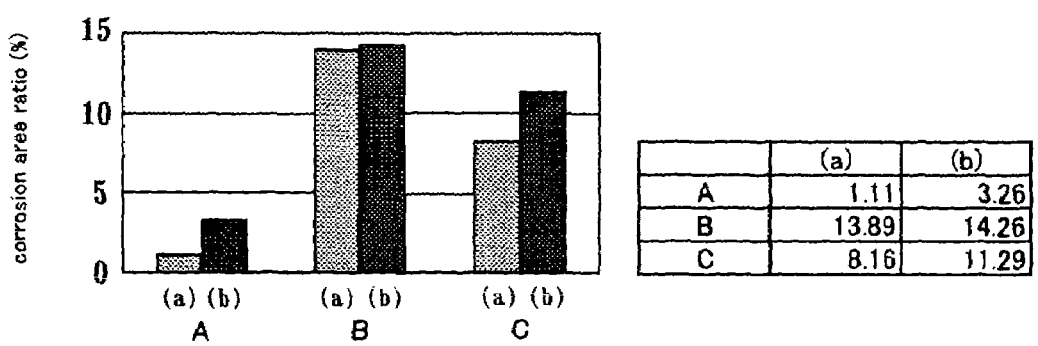
FIG. 1 illustrates a composition of an aluminum alloy as an example of an anodization-adapted aluminum alloy according to the present invention.
FIG. 2 illustrates corrosion area ratios of respective anodized films of the anodization-adapted aluminum alloy according to the present invention, a 5052-alloy, and a 6061-alloy after each of the anodized films is subjected, for 96-hours, to both salt-water spray and a CASS test.

FIG. 1 illustrates a composition of an aluminum alloy as an example of an anodization-adapted aluminum alloy according to the present invention.

The aluminum alloy having a composition as illustrated in FIG. 1 is obtained by casting molten aluminum into a billet or slab according to a semi-continuous casing process. The molten aluminum has a composition adjusted by: adding Mg having a purity of 99.95 wt % or greater to Al having a purity of 99.9 wt % or greater; and subsequently adding Ti thereto in the form of mother alloys such as Al—Ti and Al—Ti—B.

The following discusses corrosion resistance of the anodization-adapted aluminum alloy according to the present invention as provided above, and further discusses the occurrence of cracks in a film on the same aluminum alloy.

FIG. 2 illustrates corrosion area ratios of respective anodized films of the anodization-adapted aluminum alloy according to the present invention, a 5052-alloy, and a 6061-alloy after each of the anodized films is subjected, for 96-hours, to both salt-water spray and a CASS test.

In FIG. 2, signs "A", "B", and "C" denote the anodization-adapted aluminum alloy according to the present invention, the 5025-alloy, and the 6061-alloy, respectively. In addition, signs "(a)" and "(b)" denote the salt-water spray and the CASS test, respectively. A plasma-treating apparatus has an issue of corrosion resistance against corrosive gases. In general, it is very difficult to examine toxic properties of the corrosive gases used in the plasma-treating apparatus. It is also very difficult to examine actually used gases. Accordingly, both of the salt-water spray and the CASS test evaluate the corrosion resistance of each of the anodized films of the anodization-adapted aluminum alloy according to the present invention and the 5052- and 6061-alloys.

As evidenced by FIG. 2, results from the salt-water spray show that the anodized film of the aluminum alloy according to the present invention has a corrosion area ratio of only 1.11%, while the anodized films of the 5052- and 6061-alloys have corrosion area ratios of 13.89% and 8.16%, respectively. Consequently, the anodization-adapted aluminum alloy according to the present invention is superior in corrosion resistance to the other alloys. Results from the CASS test show that the anodized film of the aluminum alloy according to the present invention has a corrosion area ratio of only 3.26%, while the anodized films of the 5052- and 6061-alloys have corrosion area ratios of 14.26% and 11.29%, respectively. Consequently, the anodization-adapted aluminum alloy according to the present invention surpasses the other alloys in corrosion resistance.

Figure 3:
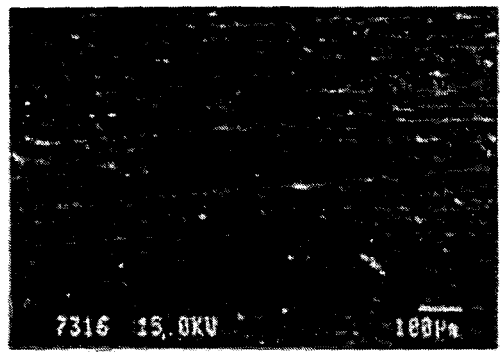
FIG. 3 illustrates photographs of the respective anodized films of the anodization-adapted aluminum alloy according to the present invention, the 5052-alloy, and the 6061-alloy, in which the photographs show the anodized films before plasma irradiation thereon, and after the plasma irradiation thereon using a $CF_4$-gas for six hours in a plasma-treating apparatus.
Figure 3:
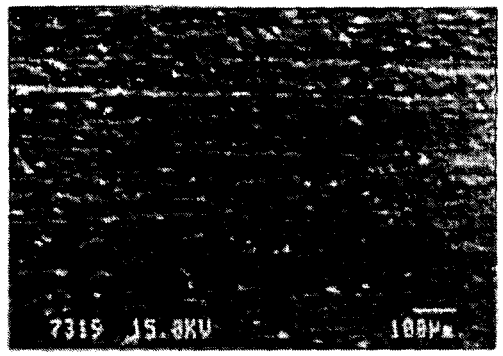
Figure 3:
Figure 3:
Figure 3:
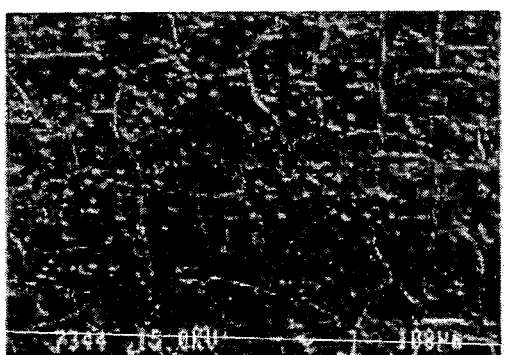
Figure 3:
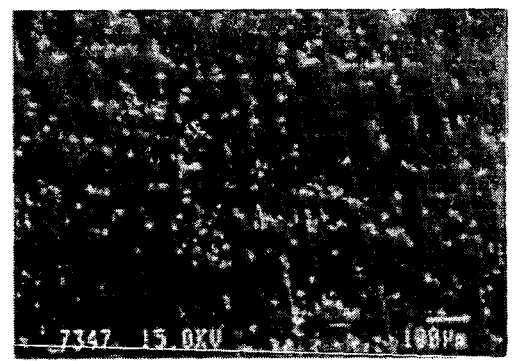

FIG. 3 illustrates photographs of the respective anodized films of the anodization-adapted aluminum alloy according to the present invention, the 5052-alloy, and the 6061-alloy. The photographs show the anodized films before plasma irradiation thereon, and after the plasma irradiation thereon using a $CF_4$-gas for six hours in the plasma-treating apparatus. In FIG. 3, signs "A", "B", and "C" denote the anodization-adapted aluminum alloy according to the present invention, the 5052-alloy, and the 6061-alloy, respectively. In addition, signs "(c)" and "(d)" show post-plasma irradiation and pre-plasma irradiation, respectively.

As evidenced by FIG. 3, the anodized film of the anodization-adapted aluminum alloy according to the present invention is found to be more resistant to crack than the anodized films of the 5052- and 6061-alloys when the plasma is irradiated onto these three different alloys.

FIG. 4 illustrates the thickness of each of the anodized films of the aluminum alloy according to the present invention, the 5052- and 6061-alloys before the plasma irradiation thereon, and after the plasma irradiation thereon using the $CF_4$-gas for six hours in the plasma-treating apparatus. In FIG. 4, signs "A", "B", and "C" denote the anodization-adapted aluminum alloy according to the present invention, the 5052- and 6061-alloys, respectively. In addition, signs "(e)", "(f)", and "(g)" denote film thickness before the plasma irradiation, film thickness after the plasma irradiation, and a reduction in film thickness during the plasma irradiation.

As evidenced by FIG. 4, the plasma irradiation reduces the thickness of the anodized film of the 5052-alloy from 56.7 $\mu$m to 43.3 $\mu$m. This means that the anodized film is reduced in thickness by an amount of 13.4 $\mu$m. Similarly, the plasma irradiation reduces the thickness of the anodized film of the 6061-alloy from 54 $\mu$m to 37.8 $\mu$m. That is, the anodized film is reduced in thickness by an amount of 16.2 $\mu$m. Meanwhile, the plasma irradiation reduces the thickness of the anodized film of the anodization-adapted aluminum alloy according to the present invention from 52.7 $\mu$m to 44 $\mu$m. That is, the anodized film is reduced in thickness by an amount of only 8.7 $\mu$m. Consequently, the anodization-adapted aluminum alloy according to the present invention provides an anodized film immune to the plasma irradiation to a certain degree.

An $Mg_2Si$-precipitating alloy material worked by forging and rolling must be subjected to solution heat treatment and subsequently an aging process. In contrast, the anodization-adapted aluminum alloy according to the present invention does not need any heat treatment. Accordingly, the anodization-adapted aluminum alloy according to the present invention is superior in cost as well as quenching that is involved in heat-treated hard alloys such as the Mg2Si-precipitating alloy material.

Elements such as Cr and Mn are often added to the 5052- and 6061-alloys in order to provide a material having minute crystal grains. In this instance, significant amounts of such elements must be added to provide sufficiently minute grains. However, the presence of the elements such as Cr and Mn are objectionable in a semiconductor because these are named as heavy metal contamination elements. In contrast, the anodization-adapted aluminum alloy according to the present invention has a very minute amount of Ti added thereto. In addition, Ti less involves heavy metal contamination in the semi-conductor. This feature sufficiently limits the plasma-caused scattering of heavy metals from the anodized film.

What is claimed is:

1. An anodization-adapted aluminum alloy consisting of 2.0 to 3.5 wt % Mg, 0.004 to 0.01 wt % Ti, and the remainder of high purity aluminum having a purity of 99.9 wt % or greater.

2. A plasma-treating apparatus made of an anodization-adapted plasma alloy, designed to allow an article to be processed to experience predetermined treatment in a vacuum chamber, using one of plasma and active species that are occurred by the plasma, said plasma-treating apparatus characterized in that one or more kinds of components selected from among said vacuum chamber and components provided in said vacuum chamber comprise an aluminum alloy consisting essentially 2.0 to 3.5 wt % Mg, 0.004 to 0.01 wt % Ti, and the remainder of high purity aluminum having a purity 99.9 wt % or greater.

* * * * *